METHOD OF FABRICATING INSULATED-GATE FIELD-EFFECT DEVICES

Filed Oct. 13, 1966 2 Sheets-Sheet 1

INVENTORS
ROBERT H. DAWSON,
NORMAN H. DITRICK &
MUNI M. MITCHELL

BY Abraham Sherman
Attorney

INVENTORS
ROBERT H. DAWSON,
NORMAN H. DITRICK &
MUNI M. MITCHELL

BY Abraham Sherman
Attorney

United States Patent Office 3,455,020

Patented July 15, 1969

3,455,020

METHOD OF FABRICATING INSULATED-GATE FIELD-EFFECT DEVICES

Robert H. Dawson, New Brunswick, Norman H. Ditrick, Somerville, and Muni M. Mitchell, Edison, N.J., assignors to Radio Corporation of America, a corporation of Delaware

Filed Oct. 13, 1966, Ser. No. 586,546

Int. Cl. H01g *13/00;* H01l *11/14;* B01j *17/00*

U.S. Cl. 29—571 7 Claims

ABSTRACT OF THE DISCLOSURE

An insulated-gate field-effect transistor is fabricated by depositing a doped dielectric coating on a portion of the surface area between the source and drain regions of the device; heating the device to form a diffused region intermediate the source and drain regions; forming an insulating coating over the surface between the source and drain regions; depositing two gate electrodes on the coating between the intermediate region and the source and drain regions; and forming source and drain electrodes on the source and drain regions respectively.

This invention relates to improved methods of fabricating improved semiconductor devices, and more particularly to improved methods of fabricating improved insulated-gate field-effect devices.

The type of insulated-gate field-effect device known as the MOS (Metal-Oxide-Semiconductor) transistor was described by S. R. Hofstein and F. P. Heiman in the "Insulated-Gate Field-Effect Transistor," Proceedings IEEE 51, p. 1190, September 1963. For a more detailed description of its characteristics and modes of operation, see chapters 5 and 8 of Wallmark and Johnson, "Field-Effect Transistors," Prentiss-Hall, Inc., Englewood Cliffs, N.J., 1966. One class of MOS device comprising a given type conductivity crystalline semiconductive body having an opposite type source region, a source electrode, an opposite type drain region, a drain electrode, an opposite type intermediate region spaced between the source and drain regions, and two gate electrodes on an insulating layer overlying the space between the source and intermediate regions and the drain and intermediate regions respectively, was described by M. M. Mitchell on Feb. 11, 1966 at the International Solid-State Circuits Conference in Philadelphia. See pp. 108 and 109 of the Conference "Digest of Technical Papers." Since this device has four electrodes, it may be termed an MOS tetrode. The MOS tetrode may be considered as consisting of two MOS transistors connected in cascade, so that the output from the drain of the first MOS transistor becomes the input to the source of the second MOS transistor. Devices of this type have advantageous electrical characteristics as an amplifier, and are useful for such applications as automatic gain control. However, for best results the precise alignment of the two gate electrodes between the three regions, and their distance from the semiconductive body, must be very carfully controlled. It has been found difficult to fabricate such devices by conventional methods.

Accordingly, it is an object of this invention to provide improved methods of fabricating improved semiconductive devices.

Another object is to provide improved methods of fabricating improved insulated-gate field-effect devices.

Figure 1A:
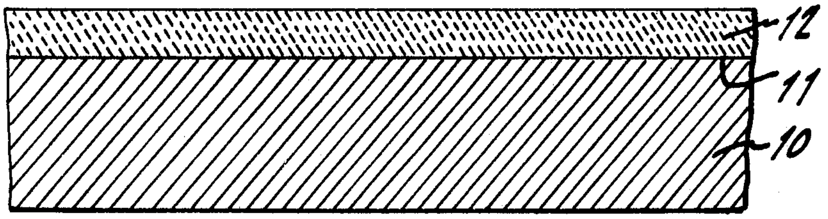
Figure 1B:
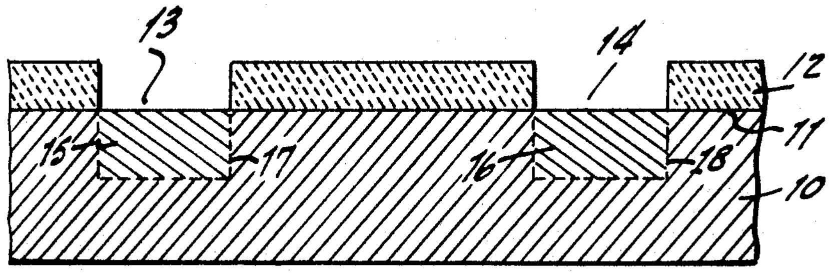
Figure 1C:
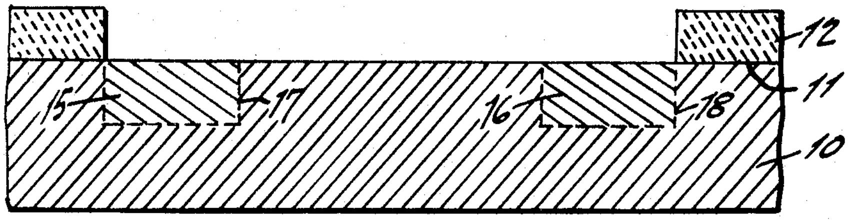
Figure 1D:
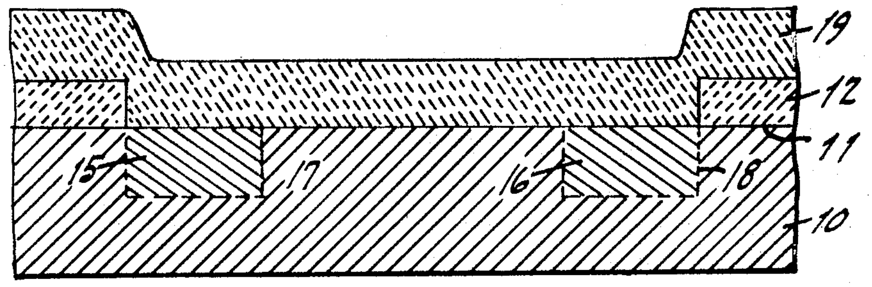
Figure 1E:
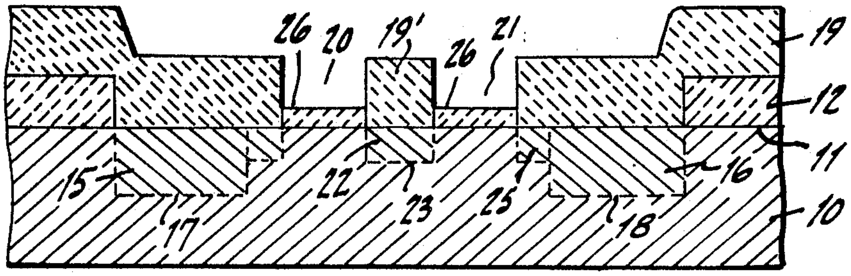
Figure 1F:
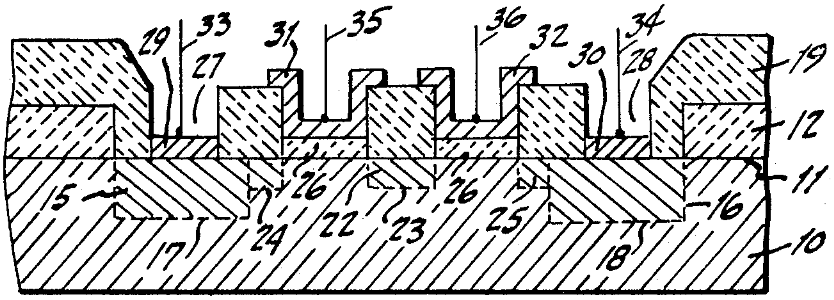
Figure 2A:
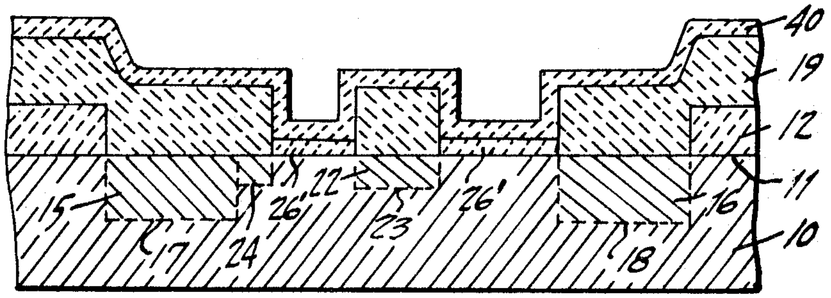
Figure 2B:
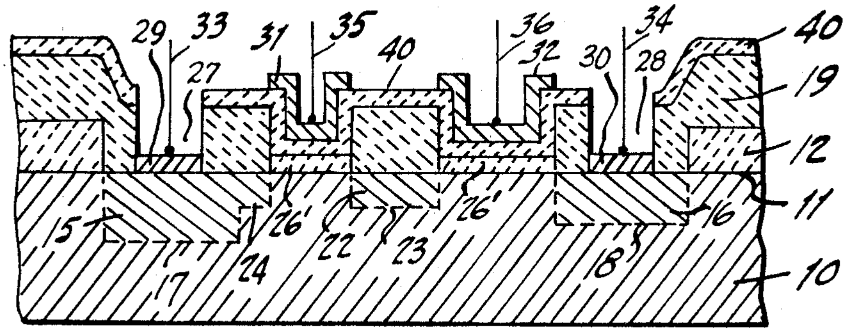

The method of the invention and its features will be described by the following examples, considered in conjunction with the accompanying drawing, in which:

FIGURES 1*a*–1*f* are cross-sectional elevational views of a semiconductor body illustrating successive steps in the fabrication of a semiconductor tetrode device according to one embodiment of the invention; and, FIGURES 2*a*–2*b* are cross-sectional elevational views of a semiconductor body illustrating successive steps in the fabrication of a semiconductor tetrode device according to another embodiment.

EXAMPLE I

A crystalline semiconductive body 10 (FIGURE 1*a*) is prepared with at least one major face 11. The exact size, shape, composition and type of conductivity of semiconductive body 10 is not critical. The semiconductive body 10 may consist of germanium, silicon, germanium-silicon alloys, the nitrides, phosphides, arsenides and antimonides of boron, aluminum, indium, and gallium, and the sulfides, selenides, and tellurides of zinc, cadmium and mercury. In this example the semiconductive body 10 is about 50 mils square, about 6 mils thick, consists of monocrystalline silicon, and is of P type conductivity. The resistivity of the semiconductive body 10 is preferably about at least 1 ohm-cm., and is about 10 to 20 ohm-cm. in this example.

A pair of spaced low resistivity source and drain regions are formed in semiconductive body 10 by any convenient method, for example by standard diffusion techniques. A layer of a material 12 which serves as a diffusion mask is formed on face 11. The diffusion mask 12 may for example consist of silicon oxide, silicon nitride, silicon oxynitride, and the like, and may be deposited from the vapor phase. In this example, the masking layer 12 consists of silicon oxide, and is formed by heating the silicon body 10 in an oxidizing ambient such as steam or oxygen until the silicon oxide layer 12 attains the desired thickness, which is suitably about 2,000 angstroms.

Referring now to FIGURE 1*b*, standard photolithographic masking and etching techniques are utilized to form two spaced openings or windows 13 and 14 in the masking layer 12. The precise size and shape of the windows 13 and 14 is not critical. In this example, windows 13 and 14 are each about 1 mil wide and 20 mils long, and are spaced about 1 mil apart along their length.

The semiconductive body 10 thus masked is heated in an ambient containing a suitable vaporized conductivity modifier capable of inducing opposite type conductivity in the body 10. Since the body 10 is P type in this example, a donor such as arsenic, antimony, phosphorus or the like is diffused into the portions of face 11 exposed by windows 13 and 14. In this example, the conductivity modifier utilized is phosphorus oxytrichloride. As a result of the diffusion step, two phosphorus-diffused regions 15 and 16 are formed in semiconductive body 10 immediately adjacent the major face 11. The size and shape of the diffused regions 15 and 16 corresponds to the size and shape of the windows 13 and 14 respectively. Rectifying barriers 17 and 18 are formed at the interface or boundary between the N type diffused regions 15 and 16 respectively and the P type bulk of the semiconductive body 10. To insure low resistivity in the regions 15 and 16, the diffusion is accomplished under such conditions of source concentration and heating profile that the concentration of charge carriers (electrons in this example) at the surface of regions 15 and 16 is preferably at least $10^{19}$ per $cm.^3$. Advantageously, the depth of the regions 15 and 16 is about 0.04 mil.

Standard masking and etching techniques are used to remove the portion of masking layer 12 between the two diffused regions 15 and 16, leaving the semiconductive body 10 as in FIGURE 1*c*.

Referring now to FIGURE 1*d*, a layer 19 of a dielectric or insulating material is deposited on the exposed portions of major face 11, and on the remaining portions of the masking layer 12. The dielectric layer 19 may consist of silicon monoxide, silicon dioxide, silicon nitride, silicon oxynitride, magnesium hydroxide, and the like. The dielectric layer 19 has incorporated therein a concentration of a substance which is a conductivity modifier in the semiconductive body 10, and is capable of inducing opposite type conductivity therein. In this example, the dielectric layer 19 consists of silicon oxide, and the conductivity modifier incorporated therein consists of phosphorus atoms. A convenient method of depositing from the vapor phase a silicon oxide layer containing a uniform concentration of a conductivity modifier such as phosphorus is described in U.S. Patent 3,200,019, issued to J. H. Scott and J. Olmstead on Aug. 10, 1965. The layer 19 thus deposited is preferably thicker than the masking layer 12. In this example, layer 19 is about 5,000 angstroms thick.

Standard masking and etching techniques are utilized to form two spaced windows or openings 20 and 21 (FIGURE 1*e*) in layer 19. The windows 20 and 21 are disposed between regions 15 and 16 and are spaced from each other and from the regions 15 and 16. The windows 20 and 21 thus define a predetermined portion 19' of the doped insulating coating 19. Portion 19' is midway between regions 15 and 16. Other portions of coating 19 are left on regions 15 and 16 and extend inwardly over the periphery of these regions toward the portion 19' of the doped coating 19.

The semiconductive body 10 is now heated to diffuse the conductivity modifier from those parts of coating 19, including portion 19', which are in direct contact with major face 11. An opposite type conductivity (N type in this example) region 22 is thus formed in semiconductive body 10 immediately adjacent major face 11 and spaced between regions 15 and 16. The size and shape of region 22 conforms to the size and shape of the portion 19' of the doped oxide coating. In this example, region 22 is about 0.4 mil wide, 0.02 mil deep, and has a surface charge carrier concentration of about $10^{19}$ per $cm.^3$ in this embodiment. A rectifying barrier 23 is formed at the interface between the given type conductivity body 10 and the opposite type conductivity region 22. In this example, shallow N type regions 24 and 25 are simultaneously formed in the semiconductive body 10 between regions 15 and 16 immediately adjacent regions 15 and 16 rsepectively by diffusion from those parts of coating 19 which are in direct contact with face 11. The rectifying barriers 17 and 18 now extend around the peripheries of regions 24 and 25 respectively.

The diffusion of a conductivity modifier into a semiconductive body is generally performed in a nonoxidizing ambient such as a reducing ambient or a neutral ambient in order to avoid oxidizing the semiconductive body. However, in this method, the diffusion step described in the preceding paragraph with reference to FIGURE 1*e* is performed by heating the semiconductive body in an oxidizing ambient such as air or steam. An insulating oxide layer 26 is thus formed during the diffusion step on the portions of face 11 which are left unmasked by the windows 20 and 21. The duration and temperature of the diffusion step are controlled so that the thickness of the insulating layer 26 thus formed is less than one-half the thickness of the masking layer 12. In this example, the thickness of the insulating layer 26 is about 400 to 600 angstroms.

Referring now to FIGURE 1*f* windows 27 and 28 are formed in the coating 19 internally the regions 15 and 16 respectively. The device electrodes are then fabricated by any convenient method known to the art. In this example, a metallic layer (not shown) which may for example consist of aluminum, gold, chromium, palladium, titanium, or the like, is deposited by evaporation over the entire face 11 of body 10, including both the masked and unmasked portions thereof. Standard photolithographic masking and etching techniques are then utilized to remove the undesired portions of the metallic layer, leaving the remaining portions thereof as the device electrodes. A first metallic electrode 29 is thus formed in direct contact with region 15. A second metallic electrode 30 thus formed is in direct contact with region 16. A third metallic electrode 31 is formed on insulating layer 26 overlying the space between regions 15 and 22. A fourth metallic electrode 32 is formed on insulating layer 26 overlying the space between regions 16 and 22. In the operation of the device, electrode 29 serves as the source electrode; electrode 30 serves as the drain electrode; and electrodes 31 and 32 serve as two gate electrodes. Electrodes 31 and 32 may be termed the first and second gate electrodes, or may be termed the input gate and the control gate respectively. The intermediate diffused region 22 serves as the drain region of the first MOS transistor (which has electrode 31 as the gate), and also serves as the source region of the second MOS transistor (which has electrode 32 as the gate). The portion of body 10 immediately adjacent face 11 between source region 15 and intermediate region 22, and between drain region 16 and intermediate region 22, serves as the channel of the device. To complete the device, electrical lead wires 33, 34, 35 and 36 are attached to electrodes 29, 30, 31 and 32 respectively by any convenient method, such as by thermocompression bonding or ultrasonic bonding, and the device is encapsulated and cased by standard procedures known to the art.

An important advantage of this method of fabrication is that it automatically secures very precise alignment between the edges of the insulating coating 19 and the channel of the device. The vertical portions of the gate electrodes 31 and 32 are more remote from face 11 than the horizontal portions, and are not electrically active or effective in modulating the conductivity of the channel. The horizontal portions of gate electrodes 31 and 32 are close to face 11, and are effective in modulating the device channel. As a result of this method of construction, the two gate electrodes 31 and 32 precisely cover the entire channel region, and hence modulate the entire channel, while avoiding the undesirable capacitance effect introduced when the gate electrodes overlap either the source or the drain regions. Any such capacitance degrades the high frequency performance of the device.

Another important advantage of this method is that the separation between the horizontal (effective) portions of each gate electrode and the major face 11 of body 10 may be accurately controlled and set at a predetermined small distance by controlling the thickness of the insulating layer 26.

Another advantage of this method is that the photoresist mask alignment required for forming the channel regions of the device is simplified. The channel mask patterns used to form portion 19' in FIGURE 1*f* need be only approximately centered between the initial source and drain regions 15 and 16.

EXAMPLE II

In this embodiment, the initial steps of fabricating a given type conductivity crystalline semiconductive body 10 with one major face 11, forming two spaced low resistivity regions 15 and 16 of opposite type conductivity in said body to serve as the source and drain regions respectively, and depositing a first insulating coating 19 containing an opposite type conductivity modifier over the source and drain regions and over the space between them, may be performed as described in Example I above in connection with FIGURES 1*a*–1*d*.

Referring now to FIGURE 2*a*, portions of the first insulating coating 19 are removed, leaving a first portion of the coating upon the source region 15 which extends inwardly beyond the source region 15 in the direction toward the drain region 16; a second portion of the coating 19 lies upon the drain region 16 but does not extend inwardly beyond it; and the third portion 19' of the coating is disposed between the source and drain regions and spaced from them, leaving portions of face 11 uncovered.

The semiconductive body is now heated in an oxidizing ambient as in the previous example. An opposite type conductivity region 23 is formed in body 10 immediately adjacent face 11 between and spaced from regions 15 and 16. Another opposite conductivity type region 24 immediately adjacent face 11 is also formed in body 10, but since region 24 is immediately adjacent the source region 15, and both regions are of the same conductivity type, region 24 becomes an extension of region 15.

At the same time, the oxidation of semiconductive body 10 by the oxidizing ambient causes the formation of a second insulating coating 26' on the exposed areas of face 11. As in Example I, the thickness of the second insulating coating 26' will be considerably less than the thickness of the first insulating coating 19. If the thickness of the second coating 26' is less than is desired for proper spacing of the gate electrodes from face 11, a third insulating coating 40 (FIGURE 2*a*) of controlled thickness is now deposited over the first insulating coating 19 and the second insulating coating 26'. Coating 40 may for example consist of evaporated silicon monoxide, silicon dioxide, silicon oxynitride, silicon carbide, magnesium fluoride, magnesium oxide, and the like.

Windows 27 and 28 (FIGURE 2*b*) are now formed by standard masking and etching techniques so as to expose a first area of face 11 internally of the source region 15, and a second area of face 11 internally of the drain region 16. As in the previous example, a source electrode 29 is formed on face 11 in direct contact with source region 15, and a drain electrode 30 is formed on face 11 in direct contact with drain region 16. A first control electrode 31 is formed on the third insulating coating 40 overlying the space between the source region 15 and the intermediate region 22. A second control electrode 32 is formed on the third insulating coating 40 overlying the space between the drain region 16 and the intermediate region 22. To complete the device, electrical lead wires 33, 34, 35 and 36 are attached to electrodes 29, 30, 31 and 32 respectively by any convenient method, and the device is cased by standard procedures known to the art.

The embodiments described above are by way of example only, and not limitation. The conductivity types of the various regions may be reversed. The size and shape of the source and drain regions may be varied considerably. For example, devices may be made in which the source region completely surrounds the drain region. Other insulating coatings and other conductivity modifiers and other crystalline semiconductive materials may be utilized. Various other modifications may be made by those skilled in the art without departing from the spirit and scope of the invention as set forth in the specification and in the appended claims.

What is claimed is:

1. Method of fabricating an insulated-gate field-effect device comprising:

- preparing a given type conductivity crystalline semiconductive body having at least one major face;
- forming first and second spaced low resistivity regions of opposite type conductivity in said body immediately adjacent said one face;
- depositing on said one face a first insulating coating containing a modifier capable of inducing opposite type conductivity in said body, at least a portion of said coating being disposed between and spaced from said first and second low resistivity regions, thereby exposing areas of said one face between said portion and each of said spaced regions;
- heating said body in an oxidizing ambient to diffuse said opposite type modifier from said first coating into said one face immediately beneath said coating and form a third low resistivity region of opposite type conductivity in said body which is disposed between and spaced from said first and second regions;
- forming a second insulating coating over each of said exposed areas of said one face;
- depositing first and second electrodes on said one face internally of said first and second regions respectively;
- depositing third and fourth electrodes on said second insulating coating overlying the space between said first and third regions and said third and second regions respectively; and,
- attaching electrical connections to said electrodes.

2. The method as in claim 1, wherein said second coating has a thickness less than one-half the thickness of said first coating.

3. The method as in claim 1, wherein said semiconductive body consists of a material selected from the group consisting of germanium, silicon, silicon-germanium alloys; the nitrides, phosphides, arsenides and antimonides of boron, aluminum, gallium and indium; and the sulfides, selenides and tellurides of zinc, cadmium and mercury.

4. The method of fabricating an insulated-gate field-effect device comprising:

- preparing a given conductivity type crystalline silicon body having at least one major face;
- masking said one major face to expose two spaced portions only thereof;
- diffusing an opposite conductivity type modifier into said exposed portions only of said face to form first and second spaced low resistivity regions of said opposite conductivity type in said body immediately adjacent said face;
- removing that portion only of said mask between said first and second regions;
- depositing a first insulating coating containing an opposite type conductivity modifier over the remainder of said mask and over the exposed portion of said one face, including said first and second regions and the space between said regions;
- removing portions of said first coating on said one face so as to leave a first portion of said first coating on said first region, a second portion of said first coating on said second region, and a third portion of said first coating on said one face disposed between and spaced from said first and second portions, thereby exposing an area of said one face between said first and third portions, and an area between said second and third portions of said first coating;
- heating said body in an oxidizing ambient to diffuse said opposite conductivity type modifier from the portion of said first coating on said one face into said face immediately beneath said first coating and to form beneath said third portion of said first coating a third resistivity region of said opposite type conductivity in said body disposed between and spaced from said first and second regions,
- while simultaneously forming a second insulating coating over said exposed area of said one face;
- depositing first and second electrodes on said one face internal said first and second regions respectively;
- depositing third and fourth electrodes on said second coating overlying the space between said first and third regions and said third and second regions respectively; and,
- attaching electrical connections to said electrodes.

5. The method as in claim 4, wherein said second insulating coating has a thickness less than one-half the thickness of said first insulating coating.

6. The method as in claim 4, wherein said first and second portions of said first insulating coating extend over the periphery of said first and second spaced regions toward said third portion of said first coating.

7. The method of fabricating an insulated-gate field-effect device comprising:
preparing a given type conductivity crystalline silicon body having at least one major face;
masking said one major face to expose two spaced portions only thereof;
diffusing an opposite type conductivity modifier into said exposed regions only of said face to form first and second spaced low resistivity regions of said opposite type conductivity in said body immediately adjacent said face;
removing that portion of said mask between said first and second regions;
depositing a first insulating coating containing an opposite type conductivity modifier over the remainder of said mask and over the exposed portion of said one face, including said first and second regions and the space between said regions;
removing portions of said first coating on said one face so as to leave a first portion of said first coating on said first region, a second portion of said first coating on said second region, and a third portion of said first coating on said one face disposed between and spaced from said first and second portions, thereby exposing areas of said one face between said third portion of said first coating and said first and second portions of said first coating;
heating said body in an oxidizing ambient to diffuse said opposite type conductivity modifier from said first and second portions of said first coating on said one face into said face immediately beneath said first coating, and to form beneath said third portion of said first coating a third resistivity region of said opposite type conductivity in said body disposed between and spaced from said first and second regions, while simultaneously forming a second insulating coating over said exposed area of said one face;
depositing a third insulating coating over said first and second insulating coatings;
etching first and second windows through said insulating coatings internally of said first and second regions respectively;
depositing first and second electrodes on said one face internal said first and second regions respectively;
depositing third and fourth electrodes on said third insulating coating overlying the space between said first and third regions and said third and second regions respectively; and,
attaching electrical connections to said electrodes.

References Cited

UNITED STATES PATENTS

| | | | |
|---|---|---|---|
| 3,177,100 | 4/1965 | Mayer et al. | 148—175 |
| 3,233,186 | 2/1966 | Theriault. | |
| 3,311,756 | 3/1967 | Nagata et al. | |

WILLIAM I. BROOKS, Primary Examiner

U.S. Cl. X.R.

29—578, 589; 148—187

UNITED STATES PATENT OFFICE
CERTIFICATE OF CORRECTION

Patent No. 3,455,020 July 15, 1969

Robert H. Dawson et al.

It is certified that error appears in the above identified patent and that said Letters Patent are hereby corrected as shown below:

Column 1, after line 25, insert -- The invention described herein was made in the course of, or under contract with the Army. --; line 61, "carfully" should read -- carefully --. Column 6, line 72, claim reference numeral "4" should read -- 5 --.

Signed and sealed this 28th day of April 1970.

(SEAL)
Attest:

Edward M. Fletcher, Jr.
Attesting Officer

WILLIAM E. SCHUYLER, JR.
Commissioner of Patents